United States Patent
Liou et al.

(10) Patent No.: US 11,818,964 B2
(45) Date of Patent: Nov. 14, 2023

(54) SPACER SCHEME AND METHOD FOR MRAM

(71) Applicant: Taiwan Semiconductor Manufacturing Company, Ltd., Hsin-Chu (TW)

(72) Inventors: Joung-Wei Liou, Zhudong Township (TW); Chin Kun Lan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/696,333

(22) Filed: Mar. 16, 2022

(65) Prior Publication Data

US 2022/0209101 A1 Jun. 30, 2022

Related U.S. Application Data

(63) Continuation of application No. 16/830,811, filed on Mar. 26, 2020, now Pat. No. 11,283,005.

(60) Provisional application No. 62/907,938, filed on Sep. 30, 2019.

(51) Int. Cl.
*H10N 50/80* (2023.01)
*H10B 61/00* (2023.01)
*H10N 50/01* (2023.01)

(52) U.S. Cl.
CPC .......... *H10N 50/80* (2023.02); *H10B 61/22* (2023.02); *H10N 50/01* (2023.02)

(58) Field of Classification Search
CPC ....... H01L 43/02; H01L 43/12; H01L 27/228; H10N 50/80; H10N 50/01; H10B 61/22

USPC ......................................................... 257/427
See application file for complete search history.

(56) References Cited

U.S. PATENT DOCUMENTS

| | | | |
|---|---|---|---|
| 9,893,121 B2 | 2/2018 | Sonoda et al. | |
| 2016/0380028 A1 | 12/2016 | Sonoda et al. | |
| 2017/0054070 A1 | 2/2017 | Bak et al. | |
| 2017/0069835 A1* | 3/2017 | Sonoda | H01L 43/12 |
| 2017/0077395 A1* | 3/2017 | Han | H01L 43/12 |
| 2017/0104152 A1 | 4/2017 | Bae et al. | |

(Continued)

OTHER PUBLICATIONS

Non-Final Office Action dated Jun. 11, 2021 for U.S. Appl. No. 16/830,811.

(Continued)

*Primary Examiner* — Tu-Tu V Ho
(74) *Attorney, Agent, or Firm* — Eschweiler & Potashnik, LLC

(57) ABSTRACT

An MRAM cell has a bottom electrode, a metal tunneling junction, and a top electrode. The metal tunneling junction has a side surface between the bottom electrode and the top electrode. A thin layer on the side surface includes one or more compounds of a metal found in one of the electrodes. The thin layer has a lower conductance than the MTJ. The electrode metal may have been deposited on the side during MTJ patterning and subsequently been reacted to from a compound having a lower conductance than a nitride of the electrode metal. The thin layer may include an oxide deposited over the redeposited electrode metal. The thin layer may include a compound of the electrode metal deposited over the redeposited electrode metal. A silicon nitride spacer may be formed over the thin layer without forming nitrides of the electrode metal.

20 Claims, 11 Drawing Sheets

(56) References Cited

U.S. PATENT DOCUMENTS

2017/0263861 A1 9/2017 Park et al.
2019/0036014 A1 1/2019 Ha
2019/0138467 A1 5/2019 Moon
2019/0157099 A1 5/2019 Chen et al.

OTHER PUBLICATIONS

Notice of Allowance dated Nov. 15, 2021 for U.S. Appl. No. 16/830,811.

* cited by examiner

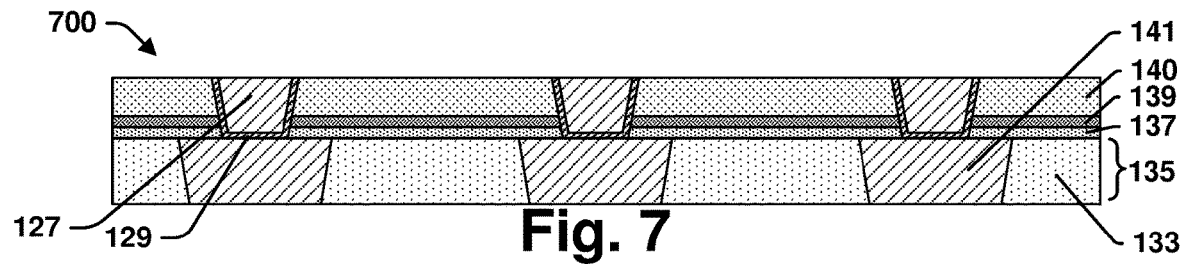
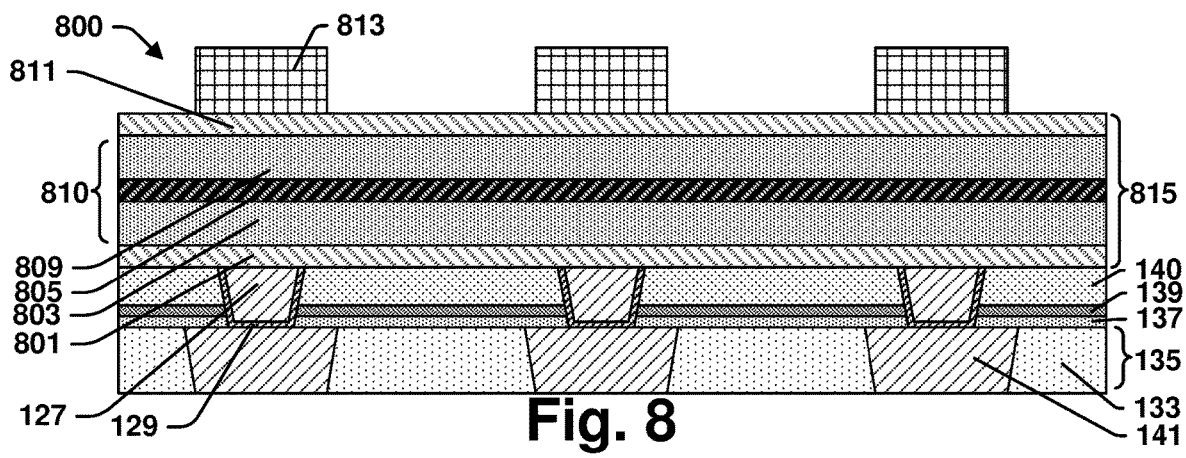
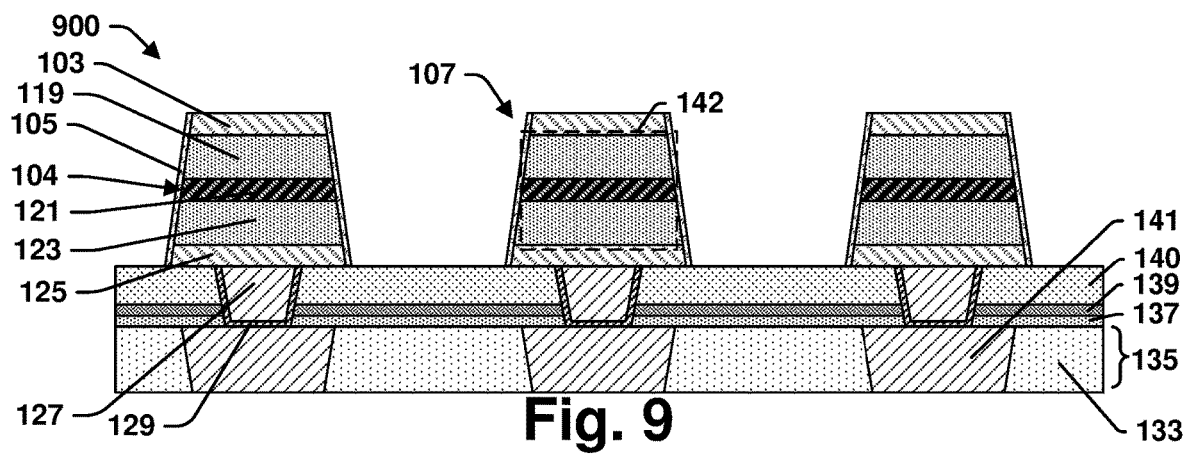

SPACER SCHEME AND METHOD FOR MRAM

REFERENCE TO RELATED APPLICATIONS

This application is a Continuation of U.S. application Ser. No. 16/830,811, filed on Mar. 26, 2020, which claims the benefit of U.S. Provisional Application No. 62/907,938, filed on Sep. 30, 2019. The contents of the above-referenced patent applications are hereby incorporated by reference in their entirety.

BACKGROUND

This disclosure relates in general to volatile and nonvolatile memory for use in stand-alone memory chips and for memory arrays integrated onto logic chips. More particularly, this disclosure relates to resistance switching random access memory devices for integrated circuits. Types of resistance switching random access memory include resistive random access memory (ReRAM), phase change memory (PCRAM), and magnetoresistive random access memory (MRAM). ReRAM may include a dielectric through which conductive bridges may be reversibly formed by application of voltage. PCRAM is based on "phase change" materials that transition from highly amorphous arrangements to crystalline arrangements with heat as the programming mechanism. MRAM store information according to the direction of magnetic moments in magnetic film layers within magnetic tunnel junction (MTJ) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-17 illustrate a series of cross-sectional views of an IC according to some aspects of the present teachings undergoing a manufacturing process according to some aspects of the present teachings.

DETAILED DESCRIPTION

Figure 1:
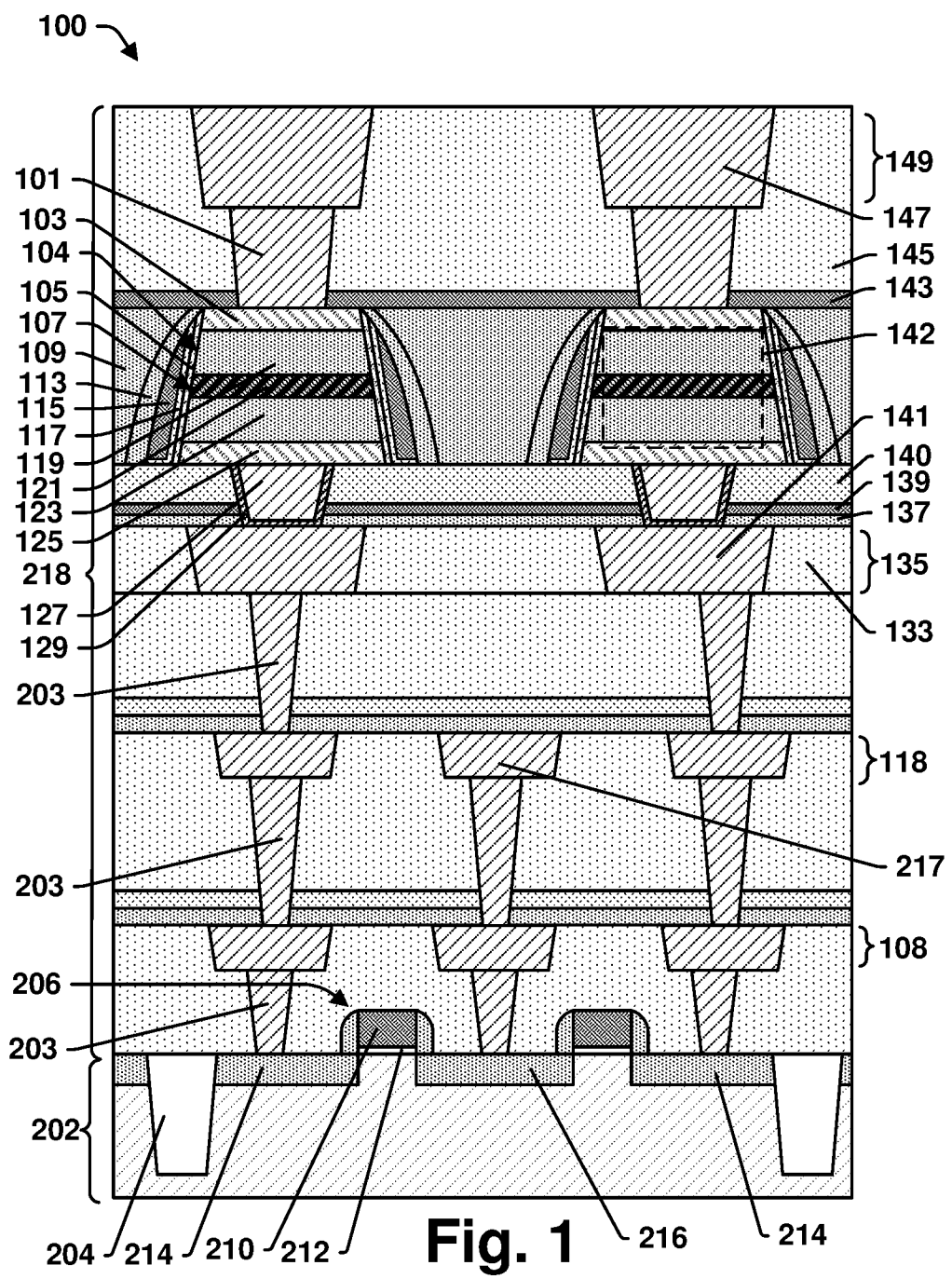
FIG. 1 illustrates a cross-sectional view of an integrated circuit (IC) with RRAM cells according to some aspects of the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Resistance switching random access memory (RRAM) includes a bottom electrode, a top electrode, and a resistance switching structure such as an MTJ in between. During patterning of the RRAM cells, it is possible for a metal, such as tantalum (Ta), from the top electrode or the bottom electrode to re-sputter onto the sides of the MTJ or other resistance switching structure. If a silicon nitride (SiN) spacer is subsequently deposited over the RRAM cell, the re-sputtered electrode metal may react to form a metal nitride layer. Current may bypass the resistance switching structure by conduction through the metal nitride layer. The bypass current may be of sufficient magnitude to interfere with the RRAM cell's operation.

In accordance with some aspects of the present teachings, the electrode metal that has been re-sputtered onto a side of the resistance switching structure is either encapsulated or converted into a high resistance compound. Encapsulation may be sufficient if the re-sputtered electrode metal does not form a continuous layer, e.g., if the re-sputtered is discontinuously distributed over the side. Encapsulation may be with an oxide, a carbide, an oxycarbide, an oxynitride, a carbonitride, an oxycarbonitride, or some other compound that either does not react with the electrode metal or reacts with the electrode metal to form a high resistance compound of the electrode metal. A high resistance compound of the electrode metal may be an oxide, a carbide, an oxycarbide, an oxynitride, a carbonitride, or an oxycarbonitride. In some of these teachings, the electrode metal is tantalum (Ta).

In some of these teaching, the re-sputtered electrode metal is converted to a high resistance compound by reaction with a flowing gas. The flowing gas may be oxygen rich and may include $O_2$, $O_3$, or the like at a partial pressure in the range from 5 to 20 torr. The reaction temperature may be in the range from 100° C. to 500° C. In some of these teachings the redeposited electrode metal is converted to a high resistance compound by reaction with a plasma. In some of these teachings the plasma source includes $O_2$, $O_3$, $N_2O$, or the like and forms an oxide of the electrode metal. In some of these teachings the plasma source includes CO and forms an oxycarbide of the electrode metal.

In some of these teaching, the re-sputtered electrode metal is coated with a thin layer that either encapsulates the re-sputtered electrode metal without reacting with the re-sputtered electrode metal or converts the re-sputtered electrode metal to a high resistance compound. In some of these teachings, the thin layer is an oxide. The oxide may react to oxidize the re-sputtered electrode metal. In some of these teachings, the oxide is one of $SiO_x$, $HfO_x$, $ZrO_x$, $TiO_x$, or $WO_x$. In some of these teachings, the thin layer has a thickness in the range from 3 Å to 30 Å. The thin layer may be formed by PVD, CVD, or ALD.

In some of these teachings, the thin layer is a high resistance compound of the electrode metal. The high resistance compound may be an oxide, a carbide, an oxycarbide, an oxynitride, a carbonitride, or an oxycarbonitride of the electrode metal. The high resistance compound may provide good coverage of the re-sputtered electrode metal and the process of depositing the high resistance compound may either encapsulate the re-sputtered electrode metal or convert the re-sputtered electrode metal into a high resistance form. In some of these teachings, the thin layer is formed into a spacer by anisotropic etching. The thin layer formed into the spacer may have a thickness that decreases along the direction from the bottom electrode to the top electrode, whereby the thin layer is thicker adjacent the bottom electrode than it is adjacent the top electrode.

In some of these teachings, the re-sputtered electrode metal is converted to a form that has a lower conductance than an insulating material that forms a resistive layer of an MTJ, such as MgO or the like. In some of these teachings, the re-sputtered electrode metal is tantalum (Ta) and is converted to a form that has a lower conductance than hexagonal $Ta_5N_6$ or any like phase of tantalum nitride. In some of these teaching, the protective layer including the re-sputtered electrode metal and has a thickness in the range from 3 Å to 30 Å.

In some of these teachings, the re-sputtered electrode metal is converted into a high resistance compound or encapsulated while the substrate is under vacuum and a layer of silicon nitride (SiN) or the like is formed over the high resistance compound while the IC device remains under vacuum. The SiN layer may be etched to form a SiN spacer. In some of these teachings, a second spacer is formed over the SiN spacer. The second spacer may be silicon nitride, silicon oxide, silicon carbide, silicon carbonitride, silicon oxycarbide, silicon oxycarbonitiride, or the like. In some of these teaching, the spaces between adjacent RRAM cells are subsequently filled with silicon nitride (SiN), silicon carbide (SiC), silicon carbonitride (SiCN), silicon oxycarbide (SIOC), silicon oxycarbonitiride (SiOCN), or the like.

Regardless of whether the re-sputtered electrode metal is encapsulated and thus prevented from forming a continuous metal nitride layer or is converted into a high resistance compound, the result is that a bypass current through the re-sputtered electrode metal is prevented from being significant in comparison to a current through the RRAM cell. The RRAM cell has a high resistance state and a low resistance state. In some embodiments, the bypass current is 20 times or less a current through the RRAM cell when the RRAM cell is in the low resistance state. In some embodiments, the bypass current is 100 times or less a current through the RRAM cell when the RRAM cell is in the low resistance state. In some embodiments, the bypass current is 1000 times or less a current through the RRAM cell when the RRAM cell is in the low resistance state.

FIG. 1 illustrates a cross-sectional view of a portion of an integrated circuit device 100 including memory cells 107 according to some aspects of the present teachings. Each memory cell 107 includes a bottom electrode 125, a metal tunneling junction (MTJ) 142, and a top electrode 103. MTJ 142 includes a first ferromagnet 123, an insulator 121, and a second ferromagnet 119. An electrode metal that is found in either the bottom electrode 125 or the top electrode 103 is also found within a thin layer 105 on a side surface 104 of the MTJ 142.

In some embodiments, the thin layer 105 forms at least an atomic layer of compounds of the electrode metal over the side surface 104. In some embodiments, compounds of the electrode metal in the thin layer 105 form a layer having a thickness of 3 Å or more. In some embodiments, the compounds of the electrode metal in the thin layer 105 are oxides, carbides, oxycarbides, oxynitrides, carbonitrides, or oxycarbonitrides of the electrode metal. In some embodiments, the compounds of the electrode metal in the thin layer 105 are oxides of the electrode metal.

In some embodiments, the thin layer 105 includes the electrode metal in a metallic form, but the metallic form does not form a continuous path between the top electrode 103 and the bottom electrode 125. In some embodiments, the electrode metal in the thin layer 105 is in compounds that are an oxide, a carbide, an oxycarbide, an oxynitride, a carbonitride, or an oxycarbonitride.

The thin layer 105 is covered by, or integral with, a protective layer 117. In some embodiments, the protective layer 117 has a thickness in the range from 2 Å to 60 Å. In some embodiments, the protective layer has a thickness in the range from 3 Å to 30 Å. The protective layer 117 includes one or more layer of oxide, carbide, oxycarbide, oxynitride, carbonitride, or oxycarbonitride. In some embodiments, the protective layer includes an oxide selected from the group consisting of $SiO_x$, $HfO_x$, $ZrO_x$, $TiO_x$, and $WO_x$. In some embodiments, the protective layer includes an oxide, a carbide, an oxycarbide, an oxynitride, a carbonitride, or an oxycarbonitride of the electrode metal.

A first spacer 115 is formed around the RRAM cell 107 and is separated from MTJ 142 by the thin layer 105 and the protective layer 117. In some embodiments, the first spacer 115 is silicon nitride (SiN). In some embodiments, the electrode metal is contained within the thin layer 105 and the protective layer 117 separates the thin layer 105 from the first spacer 115. In some embodiments, the protective layer 117 contains the electrode metal in the form of high resistance compounds of the electrode metal. In some embodiments, the protective layer 117 and the thin layer 105 are combined into a single layer.

Neither the thin layer 105, the protective layer 117, nor those two layers combined provides a conductive pathway between the top electrode 103 and the bottom electrode 125 with a conductance comparable to that of MTJ 142 or like resistance switching structure. In some embodiments, neither the material of the thin layer 105 nor the material of the protective layer 117 has as high a conductance as high as the insulating material that forms the insulator 121 of the resistance switching structure. In some embodiments, the insulator 121 is MgO.

A second spacer 113 may be formed over first spacer 115. In some embodiments, second spacer 113 is silicon nitride (SiN), silicon carbide (SiC), silicon carbonitride (SiCN), silicon oxycarbide (SIOC), silicon oxycarbonitiride (SiOCN), or the like. The spaces between adjacent MRAM cells 107 may be filled with a dielectric fill layer 109. In some embodiments, dielectric fill layer 109 is silicon nitride (SiN), silicon carbide (SiC), silicon carbonitride (SiCN), silicon oxycarbide (SIOC), silicon oxycarbonitiride (SiOCN), or the like. An etch stop layer 143 may be formed over MRAM cells 107 and dielectric fill layer 109.

Top electrodes 103 are coupled to metal features 147 in metal interconnect 149 by top electrode vias 101. Metal features 147 and top electrode vias 101 are surrounded by interlevel dielectric layer 145. In some of these teachings, interlevel dielectric layer 145 is a low κ dielectric layer. In some of these teachings, interlevel dielectric layer 145 is an extremely low κ dielectric layer. Top electrode vias 101 pass through interlevel dielectric layer 145 and etch stop layer 143 before landing on top electrodes 103. Bottom electrodes 125 are coupled to metal features 141 in metal interconnect layer 135 by bottom electrode vias 127. Bottom electrode vias 127 may be formed within etch stop layer 137, interfacial layer 139, and oxide layer 140. Metal feature 141 is surrounded by a matrix of interlevel dielectric layer 133.

Metal interconnect layer 135 and metal interconnect layer 149 are part of a metal interconnect structure 218 disposed over a substrate 202. Metal interconnect layer 135 may be the third metal interconnect layer over substrate 202 and metal interconnect layer 149 may be the fourth. Metal interconnect structure 218 also includes a first metal interconnect layer 108, a second metal interconnect layer 118, and may include additional interconnect layers above the ones that are shown. In some of these teachings, memory cells 107 are located between the third metal interconnect layer 135 and the fourth metal interconnect layer 149 as shown in the illustrations. In some of these teachings, memory cells 107 are located between a fourth metal interconnect layer 149 and a fifth metal interconnect layer. In general, memory cells 107 may be located between any pair of metal interconnect layers.

Substrate 202 may be, for example, a bulk substrate (e.g., a bulk silicon substrate) or a silicon-on-insulator (SOI) substrate, or the like. One or more shallow trench isolation (STI) regions 204 or oxide-filled trenches may be disposed in or on substrate 202. A pair of word line transistors 206 may be located between STI regions 204. Word line transistors 206 may include gates 210 that are operative as word lines. Gates 210 are separated from substrate 202 by word line dielectric layers 212. Source/drain regions 214, 216 for word line transistors 206 may be formed in or on substrate 202. A metal feature 217 in second metal interconnect layer 118 or elsewhere in metal interconnect structure 218 may be coupled to source/drain region 216 and be operative as a source line. Bottom electrodes 125 may be coupled to source/drain regions 214 through vias 203. Metal features 147 in fourth metal interconnect layer 149 or some other metal interconnect layer above memory cells 107 may be operative as bit lines. The illustrated control structure for memory cells 107 in IC device 100 is one of many possible control structures that may be used to connect and operate memory cells 107. IC devices according to the present teachings are not limited in terms of control structure.

Metal interconnect structure 218 is the product of back-end-of-line (BEOL) processing. Metal features 147, 141, 217 of metal interconnect layers 108, 118, 135, 149 and vias 101, 127, 203 may be formed of metals such as copper, aluminum, gold, tungsten, titanium nitride, and the like. Interlevel dielectric layers 133, 145 may be low κ dielectrics or extremely low κ dielectrics. A low-k dielectric is a material having a smaller dielectric constant than $SiO_2$. $SiO_2$ has a dielectric constant of about 3.9. Examples of low-k dielectrics include organosilicate glasses (OSG) such as carbon-doped silicon dioxide, fluorine-doped silicon dioxide (otherwise referred to as fluorinated silica glass (FSG), organic polymer low-k dielectrics, and porous silicate glass. An extremely low-k dielectric is a material having a dielectric constant of about 2.1 or less. An extremely low-k dielectric material is generally a low-k dielectric material formed into a porous structure. Porosity reduces the effective dielectric constant.

Bottom electrode via 127 may be titanium nitride or the like or another suitable conductive material. A diffusion barrier layer 129 may separate bottom electrode via 127 from metal feature 141. Diffusion barrier layer 129 may be, for example tantalum nitride or the like. In some examples, the thickness of diffusion barrier layer 129 is the range from about 50 Å to about 100 Å. The combined thickness of diffusion barrier layer 129 and via 127 may be in the range from 150 to 600 Å. In some embodiments, the combined thickness of diffusion barrier layer 129 and via 127 combined thickness of diffusion barrier layer 129 and via 127 is in the range from 250 to 500 Å.

Each of the layers in memory cells 107 may include a plurality of layers having various compositions. Bottom electrode 125 may include one or more layers of metal or metal compounds such as tantalum nitride, titanium nitride, tantalum, titanium, platinum, gold, iridium, tungsten, nickel, ruthenium, copper, tungsten silicide, a combination thereof, or the like. In some of these teachings, the thickness of bottom electrode 125 is in the range from about 30 Å to about 500 Å. In some of these teachings, the thickness of bottom electrode 125 is in the range from about 50 Å to about 300 Å.

First ferromagnet 123 and second ferromagnet 119 of MTJ 142 are materials with ferromagnetism. Materials with ferromagnetism include cobalt-iron-boron (CxFeB), cobalt-iron (CoFe), and nickel-iron (NiFe), cobalt (Co), iron (Fe), nickal (Ni), iron-boron (FeB), iron-platinum (FePt), and the like. The first ferromagnet 123 and the second ferromagnet 119 may be different materials. In some embodiments, both first ferromagnet 123 and second ferromagnet 119 are $Co_xFe_yB_z$ although the atomic ratios (x, y z) may differ between the first ferromagnet 123 and the second ferromagnet 119. First ferromagnet 123 and second ferromagnet 119 may be formed by any suitable process. Examples of suitable processes may include electroplating, electroless plating, sputtering, chemical vapor deposition (CVD), or another applicable process or the like.

Insulator 121 is a dielectric layer. Examples of materials that may be suitable for insulator 121 include magnesium oxide (MgO), aluminum oxides ($Al_xO_y$), titanium oxides ($TiO_x$), and the like. In some embodiments, insulator 121 is magnesium oxide (MgO). Insulator 121 may be formed by any suitable process. A suitable process may be chemical vapor deposition (CVD), physical vapor deposition (PVD), atomic layer deposition (ALD), spin-on coating, or the like. In some of these teachings, the thickness of MTJ 142 is in the range from about 50 Å to about 700 Å. In some of these teachings, the thickness of MTJ 142 is in the range from about 100 Å to about 500 Å.

Top electrode 103 is disposed over MTJ 142. Top electrode 103 may include a liner of tungsten or the like. Top electrode 103 may comprise one or more layers of metal or metal compounds such as tantalum nitride, titanium nitride, tantalum, titanium, platinum, gold, iridium, tungsten, nickel, ruthenium, copper, tungsten silicide, a combination thereof, or the like. In some of these teachings, the thickness of top electrode 103 is in the range from about 30 Å to about 500 Å. In some of these teachings, the thickness of top electrode 103 is in the range from about 50 Å to about 300 Å.

During operation of a memory cell 107 voltages are applied between top electrode 103 and bottom electrode 125. Depending on the voltages applied, the voltages may be used to assess whether memory cell 107 is in a low resistance state or a high resistance state or to place memory cell 107 in a high resistance state or a low resistance state.

MTJ 142 is one type of resistance switching structure associated with one type or resistance switching random access memory. Memory cells 107 may be any type of resistance switching random access memory and any type of resistance switching structure may replace MTJ 142. Examples of resistance switching random access memory include, without limitation, oxygen displacement memory (OxRAM), conductive bridging random access memory (CBRAM), magnetoresistive random access memory (MRAM), ferroelectric random access memory (FRAM), phase-change memory (PCM), carbon nanotube random access memory (NRAM), and the like. Various layers of various thicknesses and compositions may replace MTJ 142 in memory cells 107 to provide resistance switching structures associated with these various types of resistance switching random access memory. For example, instead of MTJ 142, memory cells 107 may include an amorphous oxide layer that reversibly forms conductive bridges and may further include an active metal layer that alternate donates and receives ions from the amorphous oxide layer.

Figure 2:
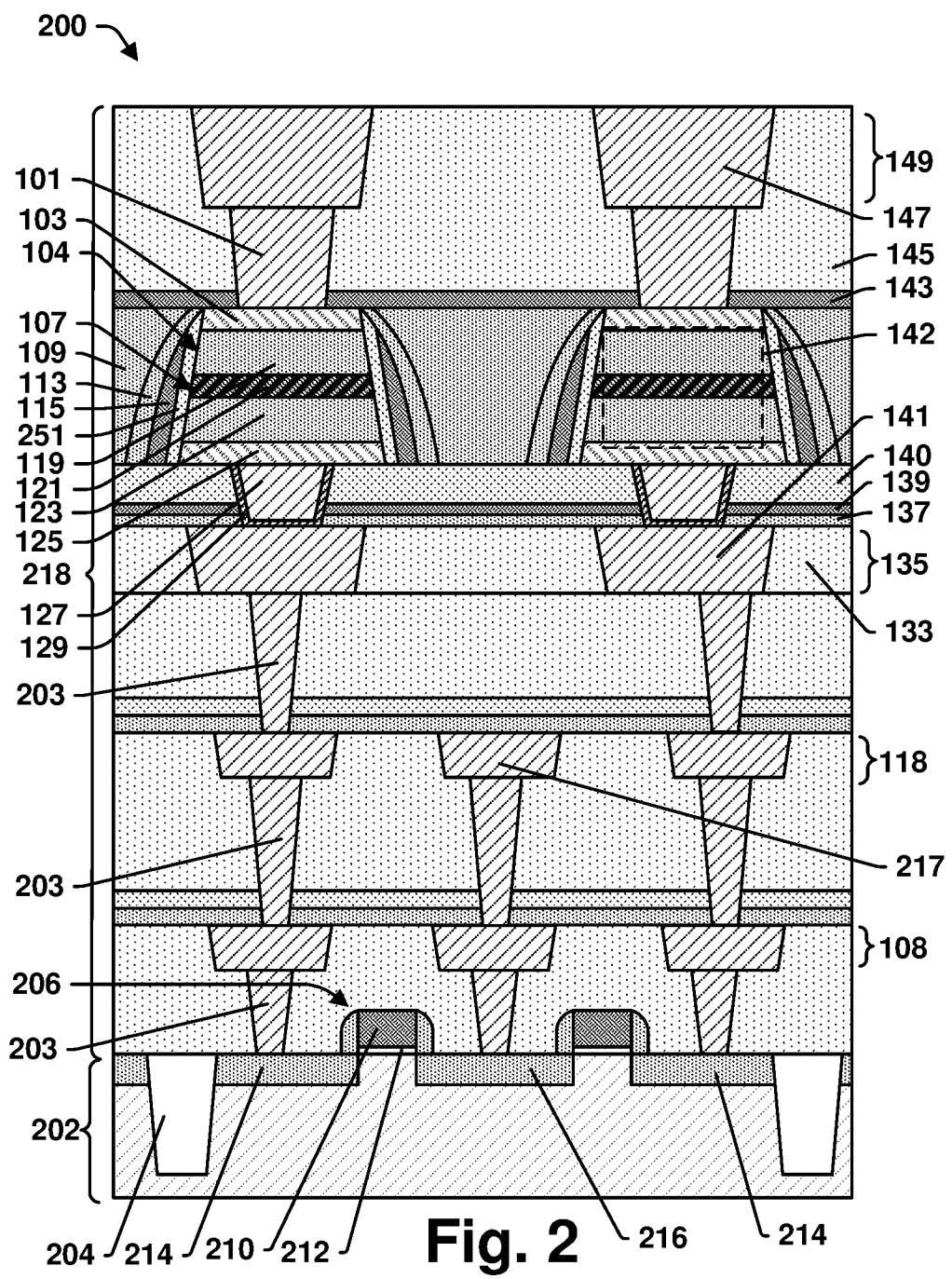
FIG. 2 illustrates a cross-sectional view of an integrated circuit (IC) with RRAM cells according to some other aspects of the present teachings.

FIG. 2 illustrates a cross-sectional view of a portion of an integrated circuit (IC) device 200. The description on IC device 100 applies to IC device 200 except that in IC device 200 thin layer 105 and protective layer 117 are in the form of a single protective layer 251. In some embodiments, protective layer 251 has a thickness in the range from 2 Å to 60 Å. In some embodiments, protective layer 251 has a thickness in the range from 3 Å to 30 Å. Protective layer 251 includes the re-sputtered electrode metal in a high resistance compound. In some embodiments, the high resistance compound is an oxide, a carbide, an oxycarbide, an oxynitride, a carbonitride, or an oxycarbonitride of the electrode metal.

In some embodiments, protective layer 251 is a single layer of uniform composition. In other embodiments, protective layer 251 is multiple layers of varying composition. In some embodiments, the electrode metal is uniformly distributed within protective layer 251. In other embodiments, the electrode metal within protective layer 251 is concentrated adjacent side surface 104.

Figure 3:
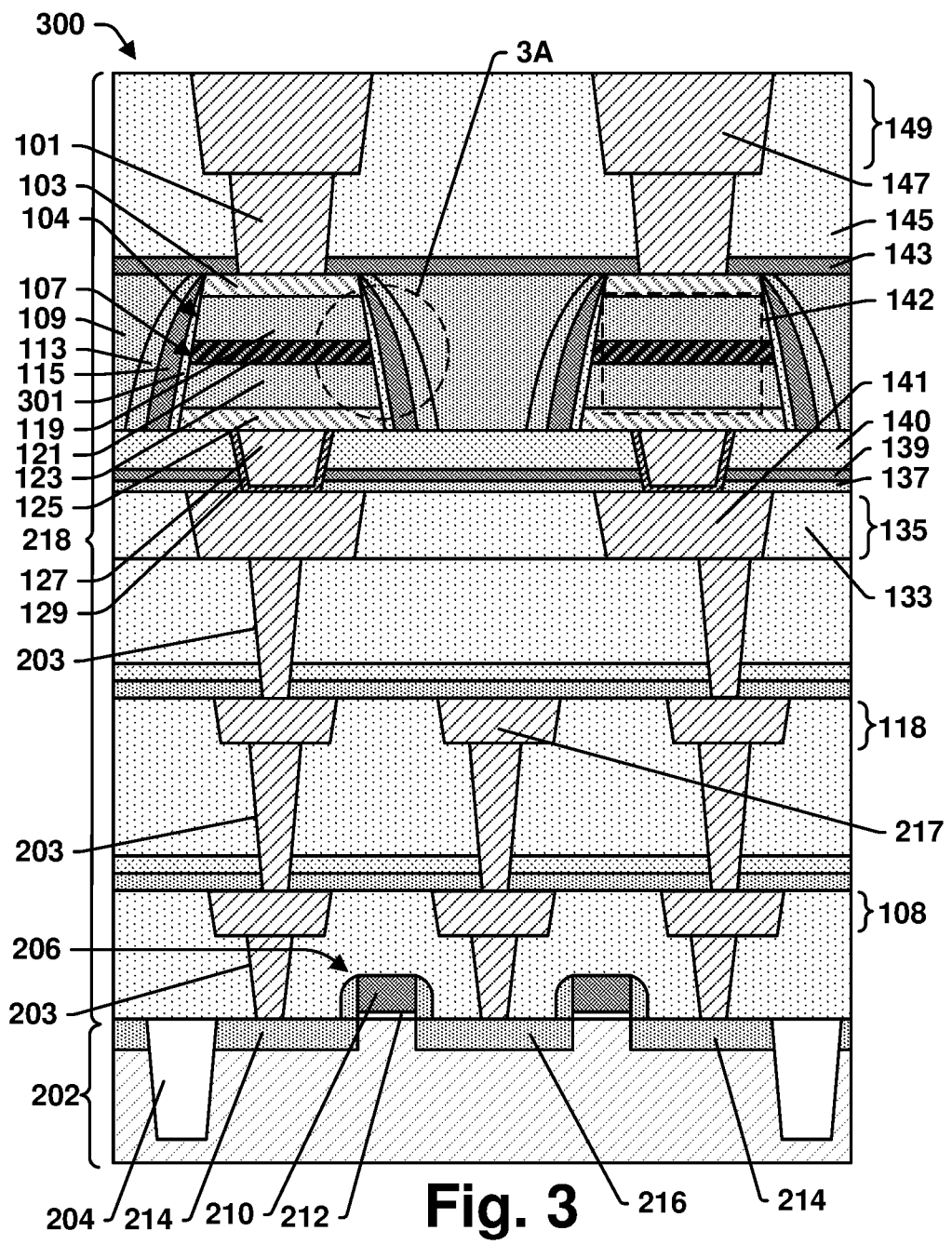
FIG. 3 illustrates a cross-sectional view of an integrated circuit (IC) with RRAM cells according to some other aspects of the present teachings.

FIG. 3 illustrates a cross-sectional view of a portion of an integrated circuit (IC) device 300. The description on IC device 200 applies to IC device 300 except that in IC device 300 has a protective layer 301 instead of the protective layer 251. The composition of protective layer 301 may be the same as that of protective layer 251. Protective layer 301 may include an inner layer with the composition of thin layer 105 and an outer layer with the composition of protective layer 117.

Figure 3A:
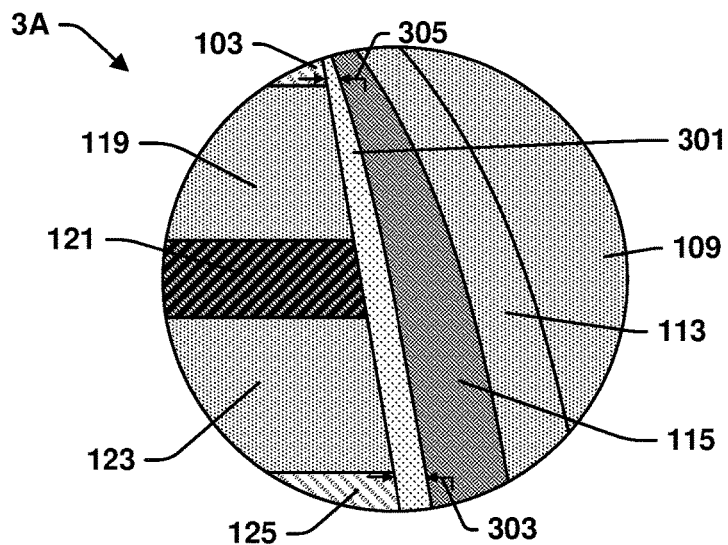
FIG. 3A provides an enlarged view of area 3A of FIG. 3.

As shown by FIG. 3A, which provides an expanded view of the area 3A of FIG. 3, protective layer 301 has a thickness that decreases with increasing distance from substrate 202. The thickness 305 of protective layer 301 adjacent top electrode 103 is less than the thickness 303 of protective layer 301 adjacent bottom electrode 125. The maximum thickness of protective layer 301 adjacent top electrode 103 is less than the minimum thickness of protective layer 301 adjacent bottom electrode 125. This variation in thickness facilitates the process of filling space between adjacent MRAM cells 107 without creating voids.

FIGS. 4-17 provide a series of cross-sectional views 400-1700 that illustrate an integrated circuit device according to the present teachings at various stages of manufacture according to a process of the present teachings. Although FIGS. 4-17 are described in relation to a series of acts, it will be appreciated that the order of the acts may in some cases be altered and that this series of acts are applicable to structures other than the ones illustrated. In some embodiments, some of these acts may be omitted in whole or in part. Furthermore, it will be appreciated that the structures shown in FIGS. 4-17 are not limited to a method of manufacture but rather may stand alone as structures separate from the method.

Figure 4:
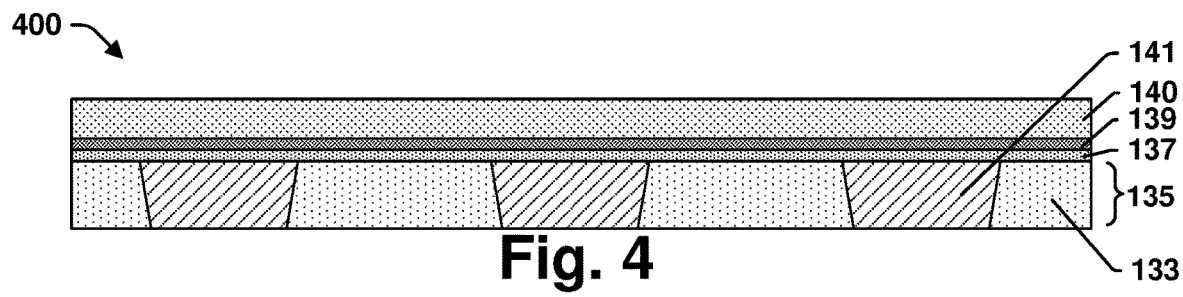

As illustrated by the cross-sectional view 400 of FIG. 4, an etch stop layer 137, an interfacial layer 139, and an oxide layer 140 may be formed over third metal interconnect 135. Third metal interconnect 135 may be formed by any suitable process. Examples of suitable processes include damascene and dual damascene processes. Etch stop layer 137 may be, for example, and silicon carbide (SiC) or the like. Interfacial layer 139 is optional and may be, for example, silicon dioxide ($SiO_2$), silicon nitride ($Si_3N_4$), silicon oxynitride (SiON), silicon oxycarbide (SiOC), or the like. Oxide layer 140 may be silicon dioxide ($SiO_2$) or the like and may be formed from tetraethyl orthosilicate ($Si(OH)_4$ or TEOS) or from some other suitable precursor. Etch stop layer 137, interfacial layer 139, and oxide layer 140 may be formed by any suitable processes or combinations of processes.

Figure 5:
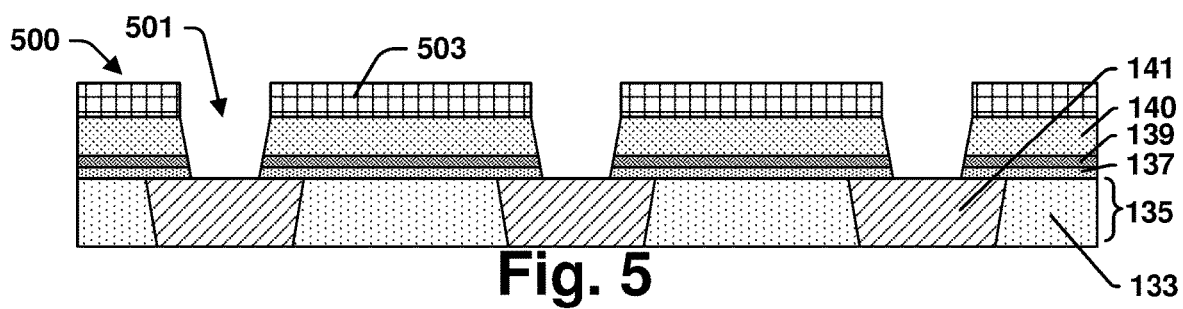

As illustrated by the cross-sectional view 500 of FIG. 5, a mask 503 may be formed over oxide layer 140 and used to form openings 501 through oxide layer 140, interfacial layer 139, and etch stop layer 137. Openings 501 are positioned over metal features 141 of metal interconnect 135. Mask 503 may be a photoresist mask patterned using photolithography. Openings 501 may be formed using any suitable etch process, for example, dry etching such as plasma etching.

Figure 6:
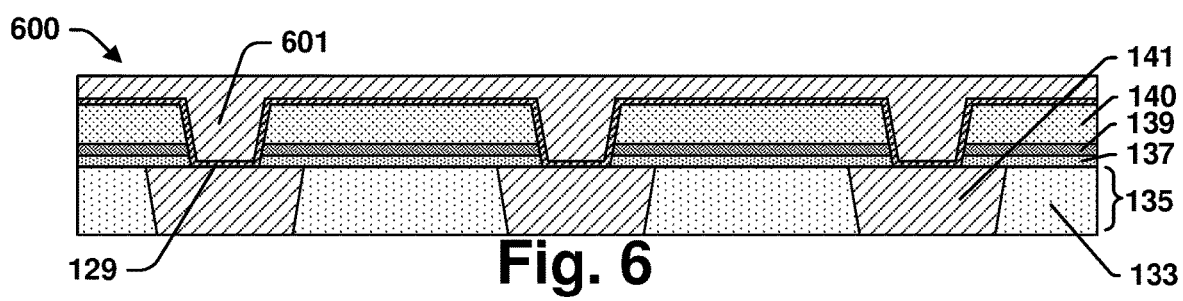

As illustrated by the cross-sectional view 600 of FIG. 6, mask 503 may be stripped followed by formation of diffusion barrier layer 129 and a layer of conductive material 601. Conductive material 601 is deposited or grown in an amount sufficient to fill openings 501. As illustrated by the cross-sectional view 700 of FIG. 7, the layer of conductive material 601 may be planarized to form vias 127. Diffusion barrier layer 129 and the layer of conductive material 601 may be formed by any suitable growth or deposition process. The planarization process may be chemical mechanical polishing (CMP) or any other suitable planarization process.

As illustrated by the cross-sectional view 800 of FIG. 8 an MRAM cell stack 815 may be formed over the surface of the structure illustrated by cross-sectional view 700 of FIG. 7. In this example, MRAM cell stack 815 includes bottom electrode layer 801, MTJ layer 810, and top electrode layer 811. MTJ layer 810 includes a first ferromagnetic layer 803, an insulating layer 805, and a second ferromagnetic layer 809. Bottom electrode layer 801, the various layers of MTJ layer 810, and top electrode 811 may be formed by any suitable process or combination of processes.

As illustrated by the cross-sectional view 800 of FIG. 8, a mask 813 may be formed over MRAM cell stack 815 and used to pattern MRAM cells 107 from MRAM cell stack 815 as illustrated by the cross-sectional view 900 of FIG. 9. Patterning forms bottom electrodes 125 from bottom electrode layer 801, first ferromagnets 123 from first ferromagnetic layer 803, insulators 121 from insulating layer 805, second ferromagnets 119 from second ferromagnetic layer 809, and top electrodes 103 from bottom electrode layer 811. Patterning may use any suitable etch process, for example, plasma etching or the like.

As illustrated by the cross-sectional view 900 of FIG. 9, during the patterning process, a thin layer 105 forms on the sides 104 of MTJs 142. Thin layer 105 contains a small amount of metal that may be from top electrode layer 811 or more likely bottom electrode layer 801. Bottom electrode layer 801 and top electrode layer 811 may have been formed by sputtering and the process by which metal from one of these layers deposits on the sides 104 of MTJs 142 is similar to sputtering. According, the electrode metal in thin layer 105 may be described as re-sputtered electrode metal.

The thin layer 105 may be only a few Angstroms thick. While the amount of re-sputtered electrode metal in thin layer 105 may not form a continuous path between top electrode 103 and bottom electrode 125, it is sufficient to form a monolayer over the sides 104. Even if the thin layer 105 does not form a continuous layer of the re-sputtered electrode metal, the re-sputtered electrode metal is sufficiently well scattered that reaction with ammonia or like chemicals used to form silicon nitride spacers can form the re-sputtered electrode metal into a continuous layer of a nitride of the re-sputtered electrode metal over the sides 104.

Figure 10:
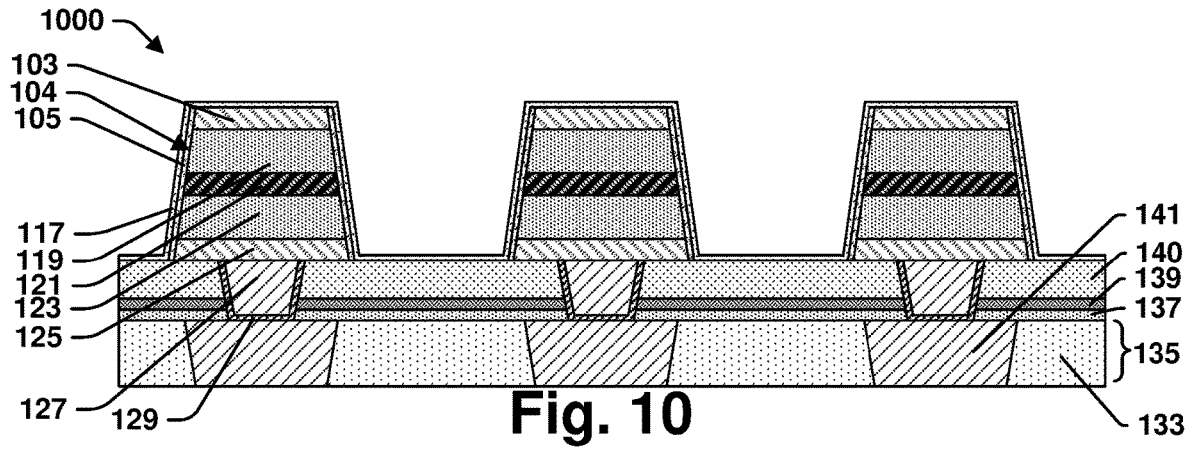

As illustrated by the cross-sectional view 1000 of FIG. 10, a protective layer 117 is formed over thin layer 105. Protective layer 117 is a high resistance layer formed with a chemistry that does not convert thin layer 105 into a continuous high conductance layer. Protective layer 117 encapsulates thin layer 105. In some embodiments, the process of forming protective layer 117 converts the re-sputtered electrode metal in thin layer 105 into a high resistance compound of the electrode metal such as an oxide, a carbide, an oxycarbide, an oxynitride, a carbonitride, or an oxycarbonitride of the electrode metal.

According to some aspects of the present teachings, protective layer 117 is formed by an oxide deposition process. Depending on the composition of protective layer 117, and interface between protective layer 117 and oxide layer 140 may or may not be visible. In some embodiments, protective layer 117 is deposited to a thickness in the range from 2 Å to 60 Å. In some embodiments, protective layer 117 is deposited to a thickness in the range from 3 Å to 30 Å. In some of these teachings, protecting layer 117 is formed from tetraethyl orthosilicate (TEOS). In some of these teachings, protecting layer 117 is formed from $SiH_4$ or the like. In some of these teachings, protecting layer 117 is formed from precursors of $HfO_x$, $ZrO_x$, $TiO_x$, or $WO_x$. In some of these teachings, protecting layer 117 formed from a metal oxide precursor, such as M-OR where "M" is a metal and "OR" is an organic. For example, M-OR may be $Ta(OCH_2CH_3)_5$. In some of these teaching, the deposition takes place under oxygen rich conditions, which may be achieved by including $O_2$, $O_3$, or the like in a process gas flow.

In some embodiments, protecting layer 117 is formed by chemical vapor deposition (CVD) at a pressure in the range from 0.5 torr to 20 torr. In some embodiments, the pressure is in the range from 1 torr to 5 torr, for example 1.5 torr. In some embodiments, protecting layer 117 is formed by CVD at a temperature in the range from 100° C. to 500° C. In some embodiments, the temperature is in in the range from 200° C. to 400° C., for example 300° C.

CVD may be enhanced by creating a plasma from the reacting gases. For example, the plasma may be generated by a radio frequency (RF) discharge. In some embodiments, the power is in the range from 10 W to 1 kW. In some embodiments, the power is in the range from 50 W to 500 W, for example 100 W.

In some embodiments, protecting layer 117 is formed by atomic layer deposition (ALD). In some embodiments, ALD takes place at a pressure in the range from 0.5 torr to 10 torr. In some embodiments, ALD takes place at a pressure in the range from 1 torr to 5 torr. In some embodiments, protecting layer 117 is formed by ALD at a temperature in the range from 100° C. to 400° C. In some embodiments, the temperature is in in the range from 200° C. to 350° C.

Figure 11:
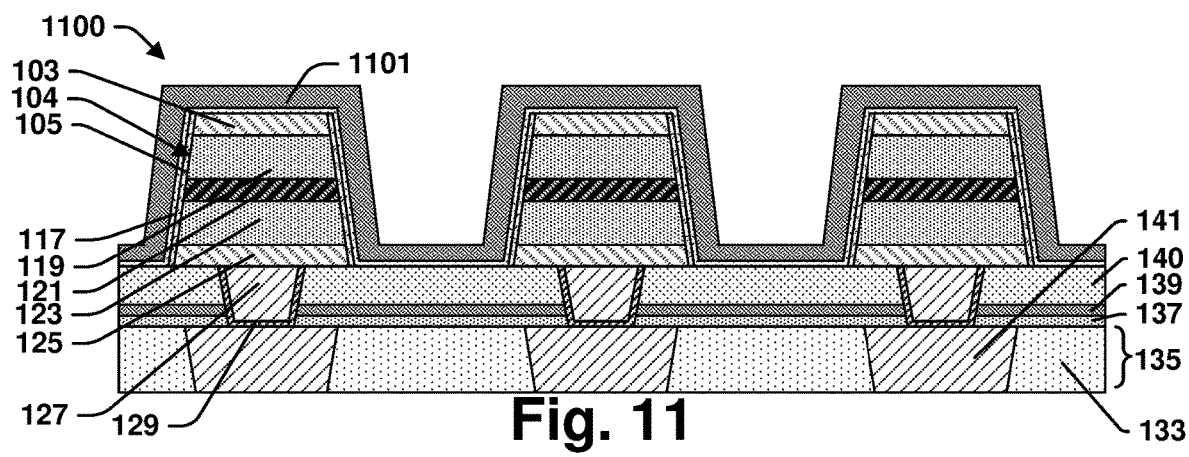

As illustrated by the cross-sectional view 1100 of FIG. 11, a spacer material 1101 may be deposited over protective layer 117 and the rest of the structure illustrated by the cross-sectional view 1000 of FIG. 10. Spacer material 1101 may be any suitable spacer material. In some embodiments, the spacer material is silicon nitride (SiN) or the like.

Spacer material 1101 may be deposited by any suitable processes or processes. A suitable process may be chemical vapor deposition (CVD), physical vapor deposition (PVD), atomic layer deposition (ALD), or the like. In some of these teachings, protective layer 117 is formed at reduced pressure and spacer material 1101 is deposited without exposing protective layer 117 to the atmosphere or atmospheric pressure. In some of these teachings, spacer material 1101 is deposited using the same tool as the one used to form protective layer 117.

Figure 12:
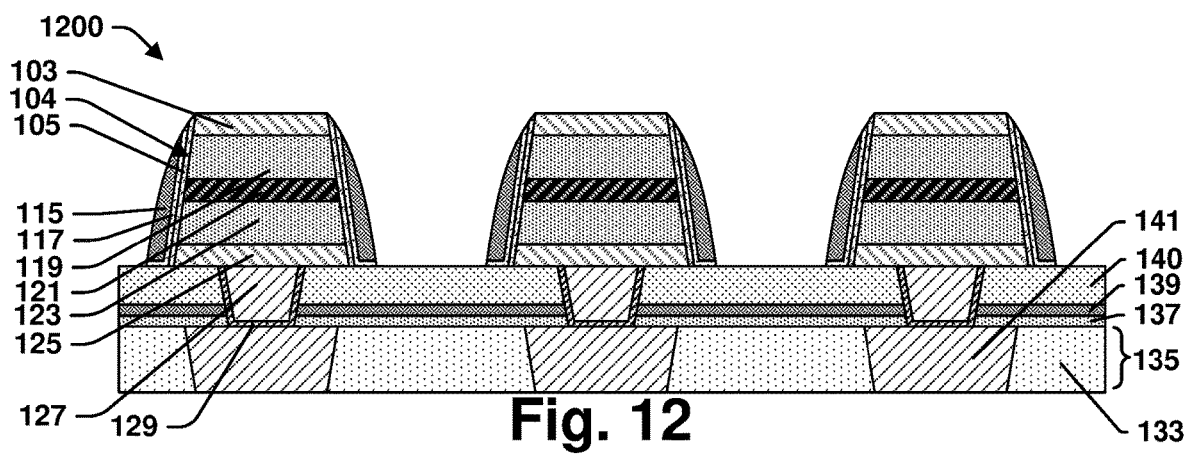

As illustrated by the cross-sectional view 1200 of FIG. 12, spacer material 1101 may be etched to form first sidewall spacers 115. The etch process may include plasma etching or any other suitable etch process(es) that selectively removes the spacer material where it is thinnest with respect to a vertical direction. In some embodiments, first sidewall spacers 115 have a thickness in the range from 20 Å to 300 Å. In some embodiments, first sidewall spacers 115 have a thickness in the range from 30 Å to 200 Å.

Figure 13:
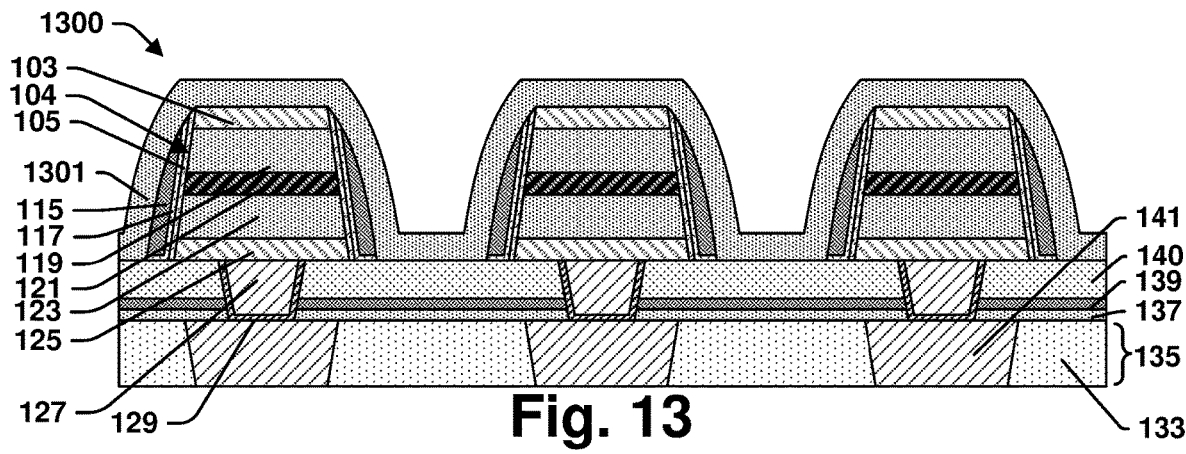

As illustrated by the cross-sectional view 1300 of FIG. 13, second spacer material layer 1301 may be deposited over the structure illustrated by the cross-sectional view 1200 of FIG. 12. The second spacer material layer 1301 may be one or more layers of any suitable dielectric material or materials. Materials that may be suitable for second spacer material layer 1301 include, without limitation, silicon nitride (SiN), silicon dioxide ($SiO_2$), silicon carbide (SiC), silicon carbonitride (SiCN), silicon oxycarbide (SIOC), silicon oxycarbonitiride (SiOCN), or the like. The material may be deposited by any suitable process or processes. A suitable process may be chemical vapor deposition (CVD), physical vapor deposition (PVD), atomic layer deposition (ALD), or the like.

Figure 14:
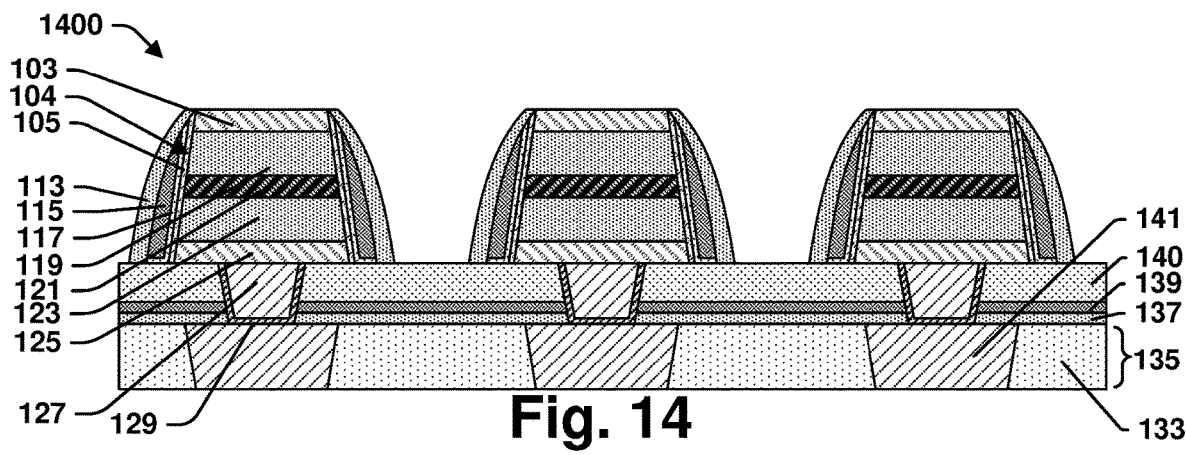

As illustrated by the cross-sectional view 1400 of FIG. 14, the second spacer material layer 1301 may be etched to form second sidewall spacers 113. The etch process may include plasma etching or any other suitable etch process(es) that selectively removes the spacer material where it is thinnest with respect to a vertical direction. In some embodiments, second sidewall spacers 113 have a thickness in the range from 20 Å to 300 Å. In some embodiments, second sidewall spacers 113 have a thickness in the range from 30 Å to 200 Å.

Figure 15:
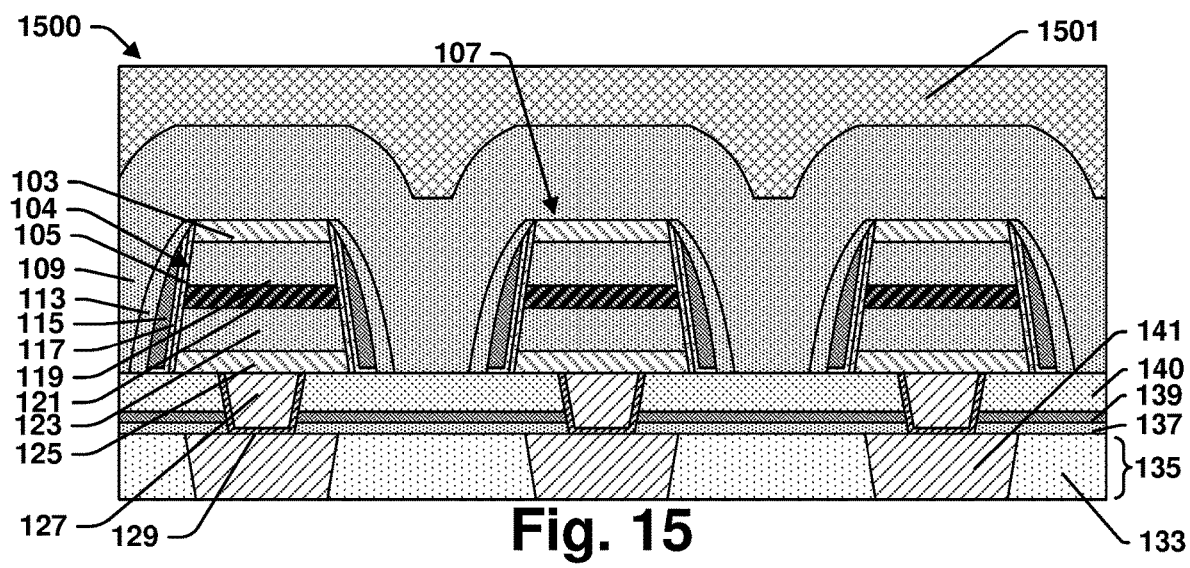

As illustrated by the cross-sectional view 1500 of FIG. 15, a dielectric fill layer 109 and a bottom anti-reflective coating (BARC) 1501 may be formed over the structure illustrated by the cross-sectional view 1400 of FIG. 14. Dielectric fill layer 109 may be a dielectric such as silicon dioxide ($SiO_2$), silicon nitride (SiN), silicon carbide (SiC), silicon carbonitride (SiCN), silicon oxycarbide (SIOC), silicon oxycarbonitiride (SiOCN), or the like. Dielectric fill layer 109 is sufficiently thick to fill the space between MRAM cells 107. Dielectric fill layer 109 may be deposited by any suitable process such as CVD, ALD, or the like. BARC 1501 may be an organic material applied by a spin-on process to form a planar upper surface.

Figure 16:
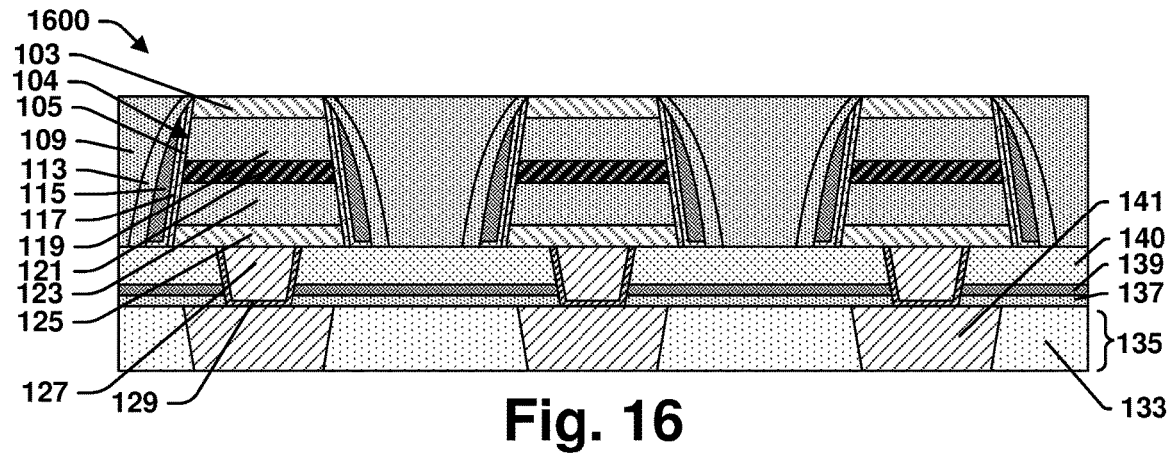

As illustrated by the cross-sectional view 1600 of FIG. 16, one or more processes may be carried out to recess the surface of the structure illustrated by the cross-sectional view 1500 of FIG. 15 sufficiently to expose top electrodes 103 while maintaining a substantially planar upper surface. The processes may include a non-selective etch back process and/or a chemical mechanical polishing (CMP) or a non-selective etch back process followed by CMP.

Figure 17:
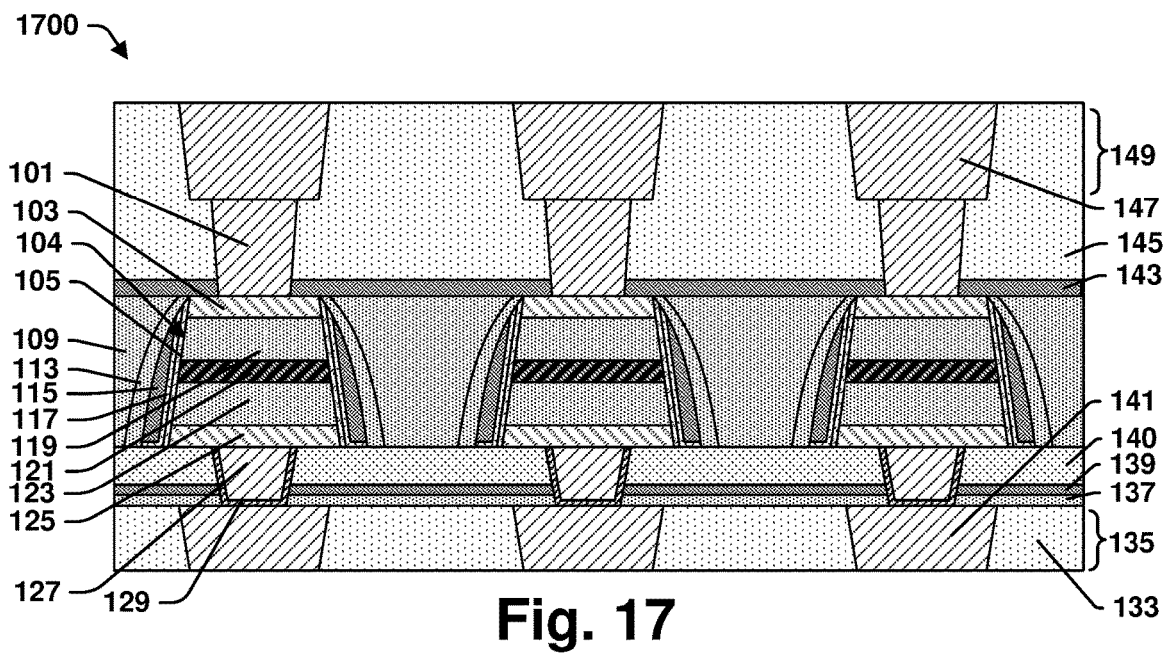

As illustrated by the cross-sectional view 1700 of FIG. 17, an etch stop layer 143 may be formed over the structure illustrated by cross-sectional view 1600 of FIG. 16. Etch stop layer 143 may be any suitable dielectric. Examples of dielectrics that may be suitable for etch stop layer 143 include silicon nitride (SiN), silicon oxynitride (SiON), silicon oxycarbide (SiOC), and the like. In some of these teachings, etch stop layer 143 is silicon nitride (SiN). Etch stop layer 143 may be formed by any suitable processes or processes. A suitable process may be chemical vapor deposition (CVD), physical vapor deposition (PVD), atomic layer deposition (ALD), or the like.

As further illustrated by the cross-sectional view 1700 of FIG. 17, an interlevel dielectric layer 145 may be formed over etch stop layer 143. Interlevel dielectric layer 145 may be a low-K or extremely low-K dielectric formed by any suitable process. Openings may be etched through interlevel dielectric layer 145 and filled with metal to form vias 101 and metal features 147 of interconnect layer 149. The process of forming vias 101 and metal features 147 may include damascene or dual damascene processing. The resulting structure may correspond to that of IC 100 of FIG. 1.

Figure 18:
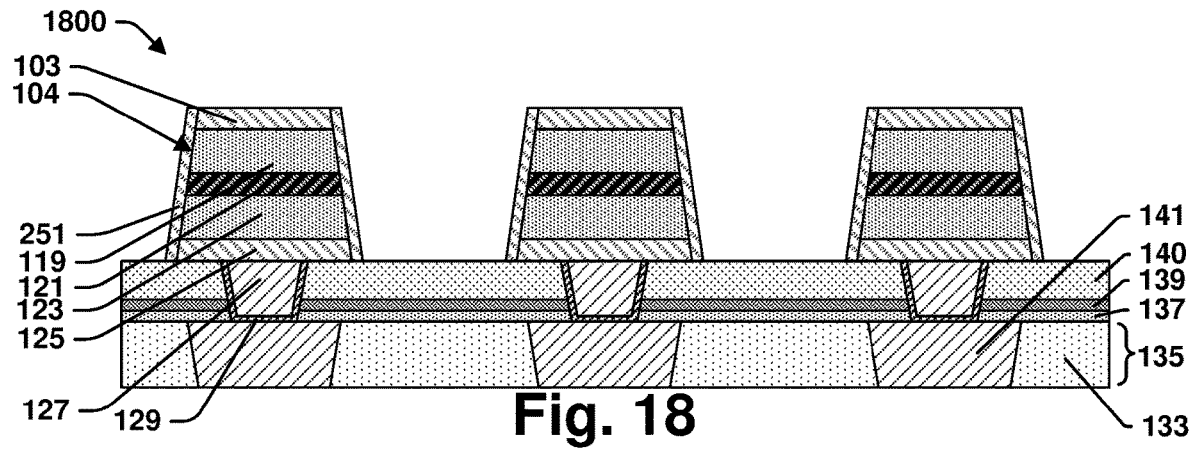
FIGS. 18-20 illustrate a series of cross-sectional views of an IC according to some other aspects of the present teachings undergoing a manufacturing process according to some other aspects of the present teachings.
Figure 19:
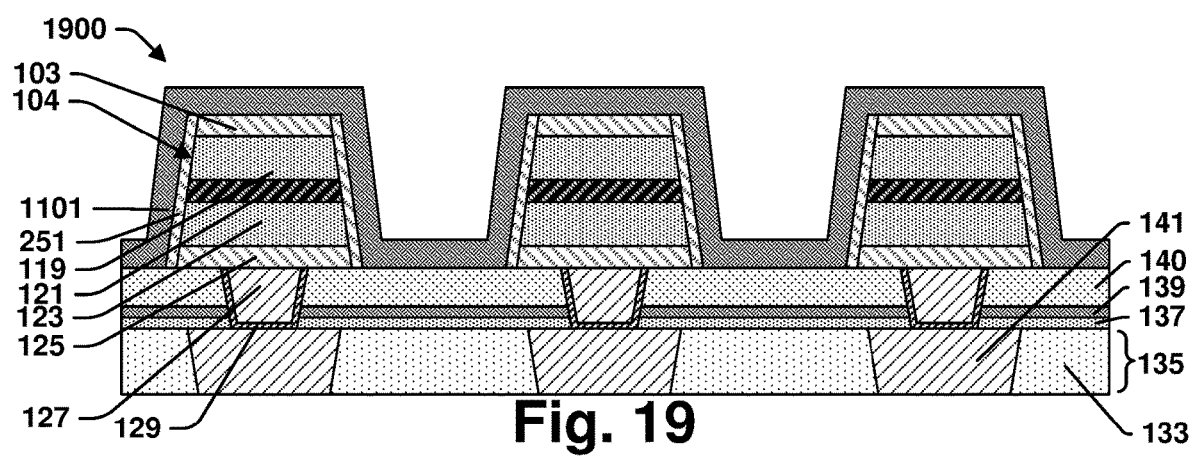
Figure 20:
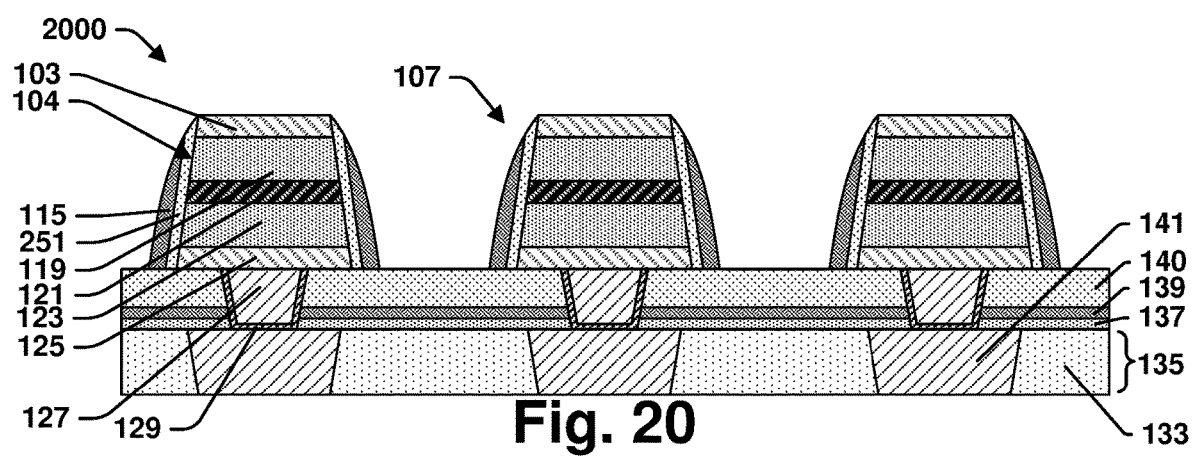

The cross-sectional views 1800-2000 of FIGS. 18-20 show alternate processing that may be used in place of the processing shown by cross-sectional views 1000-1200 of FIGS. 10-12. As shown by the cross-sectional view 1800 of FIG. 18, the formation of protective layer 251 may be limited to areas where thin layer 105 was present and the material of thin layer 105 may be incorporated into protective layer 251. In some embodiments, protective layer 251 has a thickness in the range from 2 Å to 60 Å. In some embodiments, protective layer 251 has a thickness in the range from 3 Å to 30 Å.

In some embodiment, protective layer 251 is the product of chemical reaction with the material of thin layer 105 shown in the cross-sectional view 900 of FIG. 9. In some embodiments, protective layer 251 is a high resistance compound of the re-sputtered electrode metal. In some embodiments, protective layer 251 is formed by oxidizing the re-sputtered electrode metal. Oxygen may be supplied by $O_2$, $O_3$, $N_2O$, or the like. The oxygen source may be combined with one or more other gases and the reagents may be formed into a plasma. Other gases may include Ar, He, $H_2$, or the like. Reactions other than oxidation may be used to convert the re-sputtered electrode metal into a high resistance compound. In some embodiment, the reaction gas includes $CO_2$ and the protective layer 251 is an oxycarbide of the electrode metal As shown by the cross-sectional view 1900 of FIG. 19, a layer of spacer material 1101 may be formed over the structure illustrated by the cross-sectional view 1800 of FIG. 18. Spacer material 1101 may be silicon nitride. The compounds of the re-sputtered electrode metal in protective layer 251 may be sufficiently stable that the re-sputtered electrode metal does not further react to form nitrides of the electrode metal during the process of forming the layer of spacer material 1101. The layer of spacer material 1101 may be etched to form spacers 115 as shown by the cross-sectional view 2000 of FIG. 20. The resulting structure may be further processed to produce a structure that may correspond to that of IC device 200 of FIG. 2.

Figure 21:
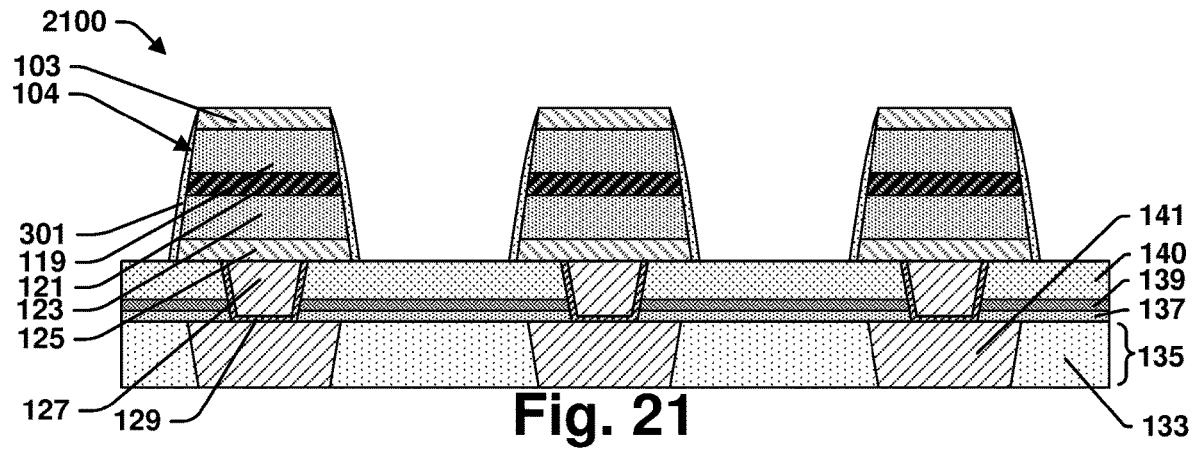
FIGS. 21-23 illustrate a series of cross-sectional views of an IC according to some other aspects of the present teachings undergoing a manufacturing process according to some other aspects of the present teachings.
Figure 22:
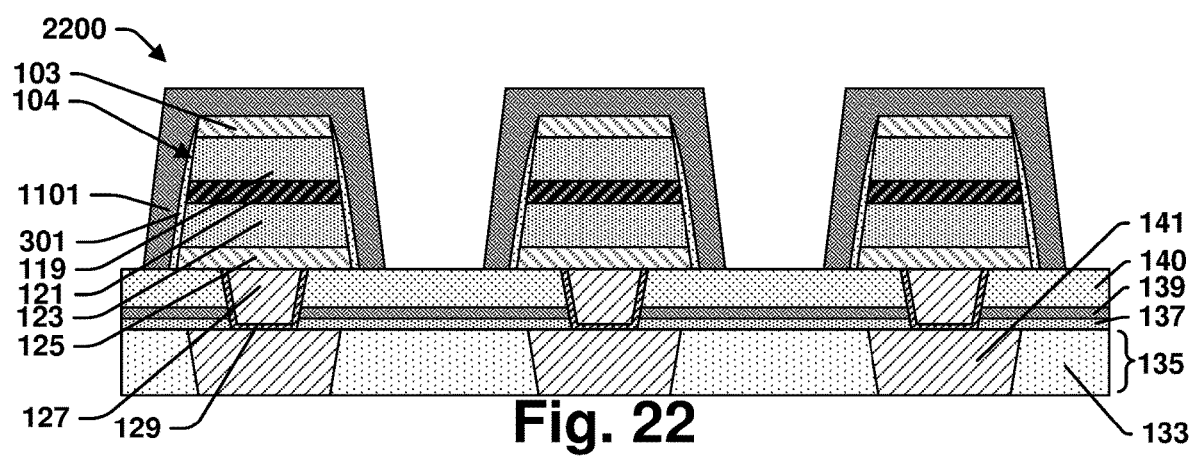
Figure 23:
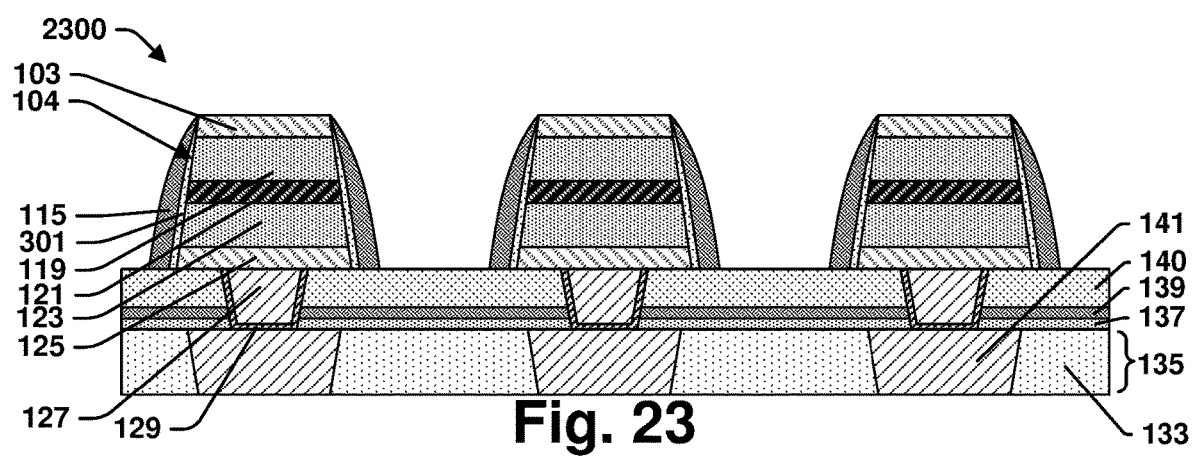

The cross-sectional views 2100-2300 of FIGS. 21-23 show an alternate processes sequence that may follow the cross-sectional view 1000 of FIG. 10 or the cross-sectional view 1800 of FIG. 18. As shown by the cross-sectional view 2100 of FIG. 21, an anisotropic etch may be used form protective layer 301, which has the shape of a spacer, from protective layer 251 or the combination of thin layer 105 and protective layer 117. A thickness of the protective layer 301 tapers from bottom electrode tapers to top electrode 103. The etch process may be a dry etch of a type used to form spacers.

As shown by the cross-sectional view 2200 of FIG. 22 and the cross-sectional view 2300 of FIG. 23, the formation of protective layer 301 may be followed by the deposition of spacer material 1101 and etching of spacer material 1101 to form spacers 115. The resulting structure may be further processed to produce a structure that may correspond to that of IC 300 of FIG. 3. Although not readily apparent from these illustrations, the etch that provides protective layer 301 with a tapering thickness may increase the slope of spacers 115 and ultimately improve the fill between MRAM cells 107.

Figure 24:
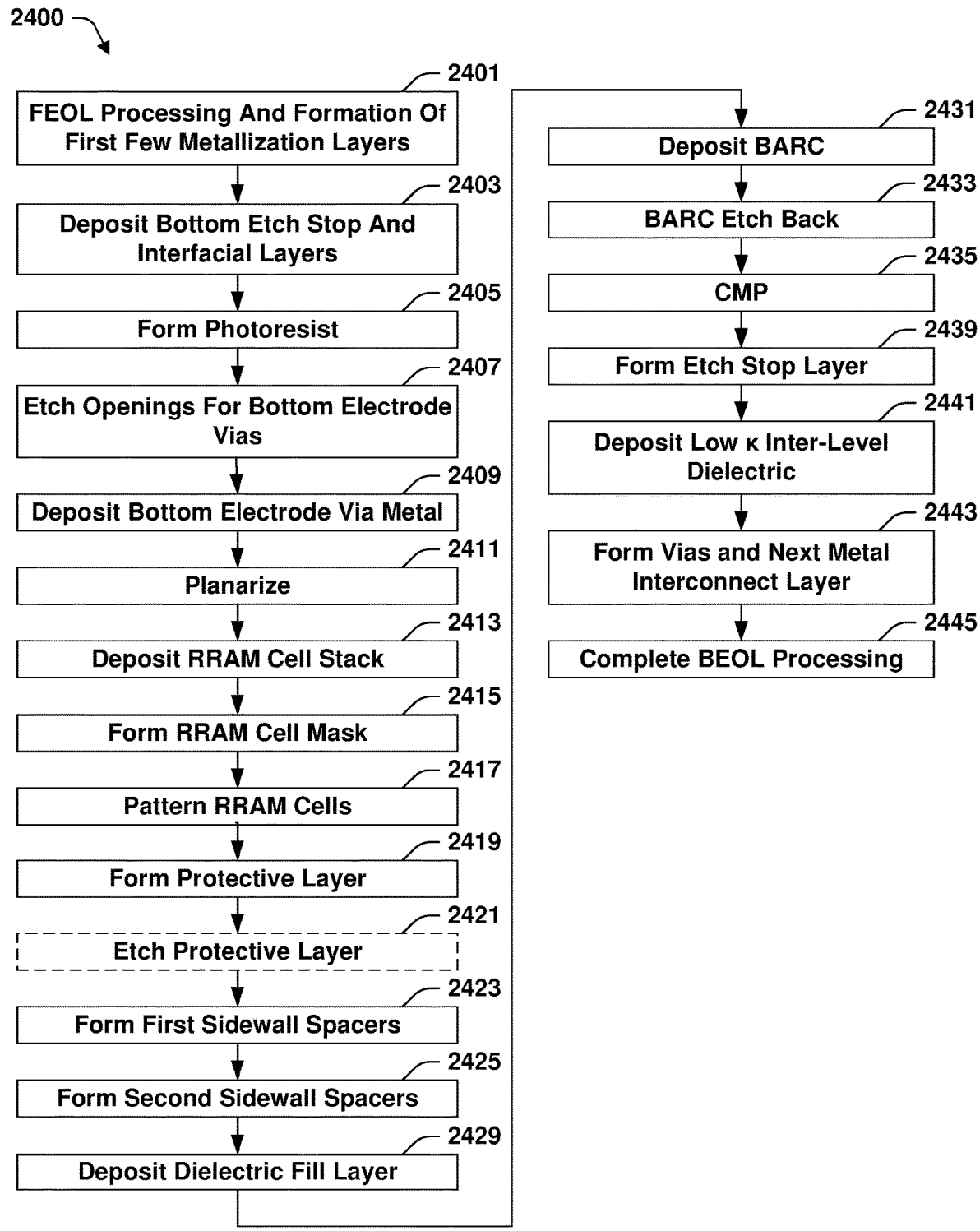
FIG. 24 present a flow chart of a manufacturing process according to some aspects of the present teachings.

FIG. 24 provides a flow chart of a process 2400 according to some aspects of the present teachings. Process 2400 may be used to produce integrated circuit devices according to the present teachings. While process 2400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Process 2400 begins with act 2401, front-end-of-line (FEOL) processing and formation of a first few metal interconnect layers 108, 118, 135 and act 2403, depositing etch stop layer 137, interfacial layer 139, and oxide layer 140 to produce a structure such as the one illustrated by cross-sectional view 400 of FIG. 4.

Process 2400 continues with act 2405, forming and patterning a mask 503 and act 2407, etching to form openings 501 in etch stop layer 137, interfacial layer 139, and oxide layer 140 as illustrated by cross-sectional view 500 of FIG. 5. Act 2409 is depositing a layer of material 601 to fill openings 501 as illustrated by cross-sectional view 600 of FIG. 6. Act 2411 is planarizing to remove the layer of material 601 that lies outside openings 501, thereby forming vias 127 as illustrated by cross-sectional view 700 of FIG. 7. Material 601 and other metal layers may be formed by any suitable process. Suitable processes may include electroplating, electroless plating, sputtering, chemical vapor deposition (CVD), or the like.

Act 2413 is forming MRAM cell stack 801 as illustrated by the cross-sectional view 800 of FIG. 8. MRAM cell stack 815 may include a bottom electrode layer 801, a resistance switching layer 810, and a top electrode layer 811. Resistance switching layer 810 may be a metal tunneling junction layer. A metal tunneling junction layer may include first ferromagnetic layer 803, insulator layer 805, and second ferromagnetic layer 809. Act 2415 is forming the photoresist mask 813.

Act 2417 is using photoresist mask 813 to pattern MRAM cell stack 815 to form MRAM cells 107 as shown in FIG. 9. Patterning MRAM cell stack 815 to form MRAM cells 107 also forms thin layer 105. Thin layer 105 contains metal from bottom electrode layer 801 and/or top electrode layer 811. Plasma used to etch MRAM cell stack 815 may causes atoms of the metal to sputter and deposit of the sides 104 of MRAM cells 107.

Act 2419 is forming protective layer 117 as shown in FIG. 10 or protective layer 251 as shown in FIG. 18. In some embodiments, Act 2419 involves forming protective layer 117 over thin layer 105 to encapsulate thin layer 105. In some embodiments, Act 2419 includes converting the electrode metal within thin layer 105 into a high resistance compound of the electrode metal. In some embodiments, Act 2419 forms thin layer 105 into protective layer 251.

Act 2421 is an optional step of performing a spacer etch on the protective layer 117, 251 to form a spacer-shaped protective layer 301 as shown in FIG. 21. The etch process may be an anisotropic dry etch, which may be a plasma etch.

Act 2423 is forming first sidewall spacers 115 as shown in FIGS. 11 and 12, or alternatively as shown in as shown in FIGS. 19 and 20 or as shown in FIGS. 22 and 23. In some embodiments, first sidewall spacers 115 are SiN, but in any case, the process of forming protective layer 117, 251, 301 ensures the re-sputtered electrode metal is not converted into nitrides of the electrode metal.

Act 2425 is forming second sidewall spacers 113. This may include depositing a layer of spacer material 1301 as shown in FIG. 13 followed by a spacer etch to form second sidewall spacers 113 as shown in FIG. 14.

Act 2429 is depositing dielectric fill layer 109 to fill space between MRAM cells 107 as shown in FIG. 15. Act 2431 is depositing BARC 1501 over dielectric fill layer 109 to form a planar upper surface as also shown in FIG. 15. Act 2433 is a non-selective etch back process that recesses the surface as shown in FIG. 15. The non-selective etch back process of act 2433 may remove various material from the top of the device while leaving the surface nearly planar.

Act 2435 is a CMP process to re-exposes top electrodes 103 of MRAM cells 107 as shown in FIG. 16. The CMP process may have a low selectivity for the material of top electrodes 103.

Act 2439 is forming etch stop layer 143 over the surface produced by the CMP process of act 2435. Act 2441 is depositing interlevel dielectric 145 over etch stop layer 143. Act 2443 is metal interconnect layer 149 and vias 101 within interlevel dielectric 145 as shown in FIG. 17. Act 2445 is additional processing to complete BEOL processing and the formation of a device such as IC device 100.

Some aspects of the present teachings relate to an integrated circuit (IC) including a substrate and a resistance switching random access memory cell formed over the substrate. The resistance switching random access memory cell includes a bottom electrode, a resistance switching layer, and a top electrode. The resistance switching layer has a side surface between the bottom electrode and the top electrode. One of the top electrode and the bottom electrode comprises an electrode metal. A spacer is formed over the side surface. In accordance with the present teachings, an amount of the electrode metal sufficient to form a thin layer is distributed over the side surface within a first layer between the side surface and the spacer. The first layer includes an oxide, a carbide, an oxycarbide, an oxynitride, a carbonitride, or an oxycarbonitride.

Some aspects of the present teachings relate to an integrated circuit (IC) including a substrate and an MRAM cell formed over the substrate. The MRAM cell includes a bottom electrode, a metal tunneling junction, and a top electrode. The metal tunneling junction has a side surface between the bottom electrode and the top electrode. A metal also found in either the top electrode or the bottom electrode is found within a thin layer on the side surface. The thin layer has a lower conductance than the metal tunneling junction.

Some aspects of the present teachings relate to a method of manufacturing an integrated circuit (IC) device. The method includes forming a metallization layer over a semiconductor substrate and forming an MRAM cell stack over the metallization layer. The MRAM cell stack includes a bottom electrode layer, a metal tunneling junction layer, and a top electrode layer. Either the bottom electrode layer or the top electrode layer includes an electrode metal. The MRAM cell stack is patterned to form an MRAM cell that includes a bottom electrode, a metal tunneling junction, and a top electrode. During the patterning process, some of the electrode metal deposits on a side of the metal tunneling junction. A protective layer is formed over the side of the metal tunneling junction. The process of forming the protective layer leaves the electrode metal on the side surface in a form that provides a lower conductance than the metal tunneling junction. A spacer is formed over the protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a substrate;
   a memory cell over the substrate, the memory cell comprising a bottom electrode, a resistance switching layer, and a top electrode, wherein the resistance switching layer has a side surface between the bottom electrode and the top electrode, and at least one of the top electrode or the bottom electrode comprises an electrode metal;
   a first layer over the side surface;
   a sidewall spacer over the first layer; and
   a second layer comprising an oxide selected from the group consisting of $SiO_x$, $HfO_x$, $ZrO_x$, $TiO_x$, or $WO_x$ between and in direct contact with the first layer and the sidewall spacer;
   wherein the first layer comprises the electrode metal and is in contact with the side surface;
   the first layer extends to a base of the bottom electrode; and
   the first layer comprises an oxide, a carbide, an oxycarbide, an oxynitride, a carbonitride, or an oxycarbonitride.

2. The IC of claim 1, wherein the electrode metal within the first layer is in compounds that are oxides, carbides, oxycarbides, oxynitrides, carbonitrides, or oxycarbonitrides of the electrode metal.

3. The IC of claim 1, wherein the electrode metal is discontinuously distributed within the first layer and is covered by the oxide, the carbide, the oxycarbide, the oxynitride, the carbonitride, or the oxycarbonitride that is also within the first layer.

4. The IC of claim 1, wherein the first layer is thicker adjacent the bottom electrode than it is adjacent the top electrode.

5. The IC of claim 1, wherein the first layer comprises an oxide of a material other than the electrode metal.

6. The IC of claim 1, wherein the sidewall spacer is silicon nitride.

7. The IC of claim 1, further comprising:
   a dielectric layer; and
   a bottom electrode via for the bottom electrode;

wherein a top of the dielectric layer is even with a top of the bottom electrode via; and the first layer is in direct contact with the dielectric layer.

8. The IC of claim 1, wherein the electrode metal is tantalum, titanium, tungsten, or ruthenium.

9. An integrated circuit (IC) comprising:
a substrate;
a memory cell formed over the substrate, the memory cell comprising a bottom electrode, a resistance switching layer, and a top electrode, wherein the resistance switching layer has a side surface between the bottom electrode and the top electrode, and at least one of the top electrode or the bottom electrode comprises an electrode metal;
an encapsulation layer over the side surface; and
a sidewall spacer over the encapsulation layer;
wherein the electrode metal in a non-oxidized state is distributed over and in contact with the side surface; and
the encapsulation layer comprises an oxide, a carbide, an oxycarbide, an oxynitride, a carbonitride, or an oxycarbonitride.

10. The IC of claim 9, the electrode metal is tantalum, titanium, tungsten, or ruthenium.

11. The IC of claim 9, wherein the encapsulation layer comprises compounds that are oxides, carbides, oxycarbides, oxynitrides, carbonitrides, or oxycarbonitrides of the electrode metal.

12. The IC of claim 11, wherein:
the resistance switching layer comprises a first ferromagnetic layer and a second ferromagnetic layer separated by a layer of insulating material; and
the compounds have lower conductance than the insulating material.

13. The IC of claim 9, wherein the electrode metal that is distributed over and in contact with the side surface is covered by and in direct contact with an oxide layer.

14. The IC of claim 13, wherein the oxide layer comprises $SiO_x$, $HfO_x$, $ZrO_x$, $TiO_x$, or $WO_x$.

15. The IC of claim 9, wherein:
the memory cell has a high resistance state and a low resistance state; and
a bypass current through the electrode metal that is distributed over and in contact with the side surface is 100 times or less a current through the memory cell when the memory cell is in the low resistance state.

16. The IC of claim 9, wherein the electrode metal is tantalum, titanium, tungsten, or ruthenium.

17. A method of manufacturing an integrated circuit (IC) device, comprising:
forming a metallization layer over a semiconductor substrate;
forming a dielectric layer over the metallization layer;
forming a bottom electrode via in the dielectric layer;
forming an MRAM cell stack over the dielectric layer, wherein the MRAM cell stack comprises a bottom electrode layer in contact with the bottom electrode via, a metal tunneling junction layer, and a top electrode layer and at least one of the bottom electrode layer or the top electrode layer comprises an electrode metal;
patterning the MRAM cell stack to form an MRAM cell comprising a bottom electrode, a metal tunneling junction, and a top electrode, wherein patterning etches through the bottom electrode layer to the dielectric layer and some metal from the bottom electrode layer deposits on a side of the metal tunneling junction during the patterning of the MRAM cell stack to form sidewall metal;
before chemically modifying the sidewall metal, beginning a deposition process that deposits an encapsulating layer over the sidewall metal, wherein the encapsulating layer comprises an oxide, a carbide, an oxycarbide, an oxynitride, a carbonitride, or an oxycarbonitride; and
forming a spacer over the encapsulating layer.

18. The method of claim 17, further comprising anisotropic etching on the encapsulating layer prior to forming the spacer.

19. The method of claim 17, wherein the electrode metal is tantalum, titanium, tungsten, or ruthenium.

20. The method of claim 17, wherein the sidewall metal is oxidized by the deposition process.

* * * * *